(12) United States Patent
Hong et al.

(10) Patent No.: US 10,164,010 B1
(45) Date of Patent: Dec. 25, 2018

(54) FINFET DIFFUSION BREAK HAVING PROTECTIVE LINER IN FIN INSULATOR

(71) Applicant: GLOBALFOUNDRIES INC., Grand Cayman (KY)

(72) Inventors: Wei Hong, Clifton Park, NY (US); Hsien-Ching Lo, Clifton Park, NY (US); Haiting Wang, Clifton Park, NY (US); Yanping Shen, Saratoga Springs, NY (US); Yi Qi, Niskayuna, NY (US); Yongjun Shi, Clifton Park, NY (US); Hui Zang, Guilderland, NY (US); Edward Reis, Ballston Spa, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/798,546

(22) Filed: Oct. 31, 2017

(51) Int. Cl.
*H01L 29/06* (2006.01)
*H01L 21/8234* (2006.01)
*H01L 27/088* (2006.01)

(52) U.S. Cl.
CPC .. *H01L 29/0649* (2013.01); *H01L 21/823431* (2013.01); *H01L 21/823481* (2013.01); *H01L 27/0886* (2013.01)

(58) Field of Classification Search
CPC ............. H01L 29/0649; H01L 27/0886; H01L 21/823431; H01L 21/823481
See application file for complete search history.

(56) References Cited

U.S. PATENT DOCUMENTS

| | | | |
|---|---|---|---|
| 8,609,510 B1 * | 12/2013 | Banna | H01L 29/66545 257/E21.409 |
| 8,916,460 B1 | 12/2014 | Kwon et al. | |
| 9,373,535 B2 | 6/2016 | Shen et al. | |
| 9,716,042 B1 * | 7/2017 | Basker | H01L 21/823431 |
| 9,929,256 B2 * | 3/2018 | Cheng | H01L 29/6681 |

\* cited by examiner

*Primary Examiner* — William Coleman
(74) *Attorney, Agent, or Firm* — Gibb & Riley, LLC; Francois Pagette

(57) ABSTRACT

Methods form integrated circuit structures that include a semiconductor layer having at least one fin. At least three gate stacks contact, and are spaced along, the top of the fin. An insulator in trenches in the fin contacts the first and third of the gate stacks, and extends into the fin from the first and third gate stacks. Source and drain regions in the fin are adjacent a second of the gate stacks. The second gate stack is between the first and third gate stacks along the top of the fin. Additionally, a protective liner is in the trench between a top portion of the insulator a bottom portion of the insulator.

20 Claims, 15 Drawing Sheets

FINFET DIFFUSION BREAK HAVING PROTECTIVE LINER IN FIN INSULATOR

BACKGROUND

Field of the Invention

The present disclosure relates to diffusion breaks used with fin-type field effect transistors (FINFETs), and more specifically, to diffusion breaks that include a protective liner within the insulator that is located in the fin.

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom.

To further reduce transistor size, multiple transistors can be formed on the top of a fin, and some of these transistors can be non-functional "dummy" transistors, that serve the sole purpose of insulating adjacent transistors from one another. Such non-functional transistors can include an underlying insulator in the fin, and such structures are sometimes referred to as diffusion breaks. For example, when the non-functional transistor is disposed with respect to one dummy line (for example, a dummy gate) between a first functional transistor and a second functional transistor, the diffusion break may be referred to as a single diffusion break (SDB); and when such is disposed with respect to two dummy lines (for example, dummy gates) between the first and second functional transistors, the non-functional transistors may be referred to as a double diffusion break (DDB).

SUMMARY

Various exemplary methods perform processing that includes, but is not limited to, forming a semiconductor layer on a substrate. The bottom (first side) of the semiconductor layer is connected to the substrate and the top (second side) of the semiconductor layer is opposite the bottom. Such methods pattern the semiconductor layer to form at least one fin extending toward the top of the semiconductor layer. The top of the fin is distal to where the bottom of the semiconductor layer contacts the substrate.

Such methods pattern the fin to form trenches. The trenches extend from the top of the fin into the fin. Methods herein form an insulator in the trenches and adjacent the fin, and then remove a portion of the insulator to reduce the thickness of the insulator. Thus, this processing removes the insulator from the top of the trenches (a first portion of trenches), but leaves the insulator in the bottom (second portion) of the trench (and in areas adjacent the fin and between adjacent fins).

These methods also form a protective liner that lines the tops of the trenches, the remainder of the insulator in the bottom of the trenches, the top of the fin, and the sides of the fin that are not contacting the insulator. For example, the insulator can be an oxide, and the protective liner can be a nitride liner. Methods herein then form a hardmask on the protective liner to fill the top of the trenches that are above the protective liner with the hardmask. Then, these processes planarize the hardmask down to the level of the protective liner on the fin to leave the hardmask in the trenches and adjacent the sides of the fins. Methods herein form a protective layer on the top of the fin and on the hardmask.

Methods herein then perform a patterned material removal process to remove a portion of the protective layer covering the hardmask, to remove the hardmask from the trenches, and to leave the protective liner in the trenches. This allows these methods to form additional amounts of the insulator in the trenches on the protective liner, and on the protective layer; and this fills the top of the trenches with the additional amounts of the insulator. Thus, the protective liner divides the insulator in the trench into a top (first) portion and a bottom (second) portion. In other words, the first portion of the insulator in the trench is between the top of the fin and the second portion in the bottom of the trench. The patterned material removal process also forms a widened section in the trench where the insulator contacts the first and third gate stacks. The widened section is wider than the second portion of the insulator. Additional processing planarizes the insulator down to the top of the fin to remove portions of the insulator that are distal to the top of the fin, and to remove the protective layer.

Methods herein then form at least three gate stacks contacting, and spaced along the top of the fin. The first and third of such gate stacks are formed on the insulator in the trenches, and a second of such gate stacks is formed on the semiconductor material of the fin, between the first and third gate stacks. Additional processing forms source and drain regions in the fin, only adjacent the second gate stack. The process of planarizing the insulator down to the top of the fin forms the surface of the insulator contacting the first and third gate stacks to be coplanar with the top of the fin. Such processing also forms portions where the insulator contacts the first and third gate stacks, and where the second gate stack contacts the fin, to all be within a single plane.

The source and drain regions, and the semiconductor portion of the fin that contacts the gate stack form a functional transistor. In contrast, the first and third gate stacks and the insulator connected to the first and third gate stacks form non-functional diffusion breaks on opposite sides of the functional transistor. Therefore, a second conductive gate of the second gate stack is connectable to a voltage source; however, first and third conductive gates of the first and third gate stacks are insulated from voltage sources. These non-functional diffusion breaks insulate the functional transistor from other structures.

Such methods produce various integrated circuit structures that include (among other components) a semiconductor layer having a bottom connected to a substrate. The semiconductor layer has at least one fin extending toward the top of the semiconductor layer. At least three gate stacks contact, and are spaced along, the top of the fin. The top of the fin is distal to where the bottom of the semiconductor layer contacts the substrate.

An insulator in trenches in the fin contacts first and third of the gate stacks. The trenches containing the insulator extend into the fin from the first and third gate stacks toward the bottom of the semiconductor layer. Additionally, a protective liner is in the trenches between a top (first) portion of the insulator and a bottom (second) portion of the insulator. Thus, the top portion of the insulator in the trench is between the first and third gate stacks and the bottom portion of the insulator. Also, the trenches and insulator include a widened section where the insulator contacts the first and third gate stacks, and the widened section is wider than the bottom portion of the trenches and insulator.

For example, the insulator can be an oxide, and the protective liner can be a nitride liner. The surface of the insulator contacting the first and third gate stacks is coplanar with the top of the fin. Further, portions where the insulator contacts the first and third gate stacks, and where the second gate stack contacts the fin, are within a single plane.

Source and drain regions in the fin are adjacent second of the gate stacks. The second gate stack is between the first and third gate stacks along the top of the fin. The second gate stack, the source and drain regions, and a semiconductor portion of the fin that contacts the gate stack form a functional transistor. However, the first and third gate stacks, and the insulator connected to the first and third gate stacks, form non-functional diffusion breaks. Thus, a second conductive gate of the second gate stack is connected to a voltage source, and first and third conductive gates of the first and third gate stacks are insulated from voltage sources. These diffusion breaks are on opposite sides of the functional transistor, and insulate the functional transistor from other structures.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, some non-functional transistors that are positioned on insulators in semiconductor fins are referred to as diffusion breaks, and such diffusion breaks isolate otherwise adjacent functional transistors from one another. When working with diffusion breaks, it can be difficult to make the fin top bigger for easier alignment of features thereon, because conventional processing can etch the silicon fin. In addition, smaller fins degrade performance. Additionally, improper size and location of the insulator beneath the non-functional transistor of the diffusion break can result in short circuits that can damage the device.

In view of such issues, the methods and devices herein use a protective liner to maintain a larger fin, without affecting single diffusion breaks; and this allows for improvements in both double diffusion break and single diffusion break device performance. The methods and devices herein can keep the same critical dimensions for both single and double diffusion breaks, with an improved epitaxial facet. More specifically, with methods herein a fin reveal is performed (without using additional masks), and a nitride liner film is deposited to protect the fin profile. Then a raise oxide at the single diffusion break region is used to form the diffusion break. Afterwards, the nitride liner is removed to expose the fin again. This provides a larger fin top critical dimension (TCD), which allows for easier alignment of features thereon, improves device performance, and avoids short circuits.

With reference to FIGS. 1A-14C, which illustrate an integrated circuit structure in cross-sectional views ("A" and "B" drawings) and a top view ("C" drawings), different manufacturing stages are shown. More specifically, the "A" drawings are a cross-section along line X-X, shown in the "C" drawings; and the "B" drawings are a cross-section a long line Y-Y, shown in the "C" drawings.

Figure 1A:
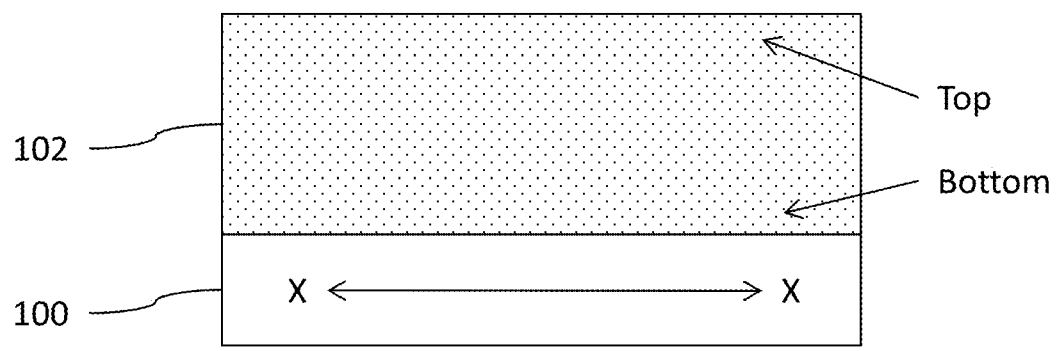
FIGS. 1A-14C, are schematic diagrams illustrating an integrated circuit structure at different manufacturing stages in cross-sectional views ("A" and "B" drawings) and a top view ("C" drawings)
Figure 1B:
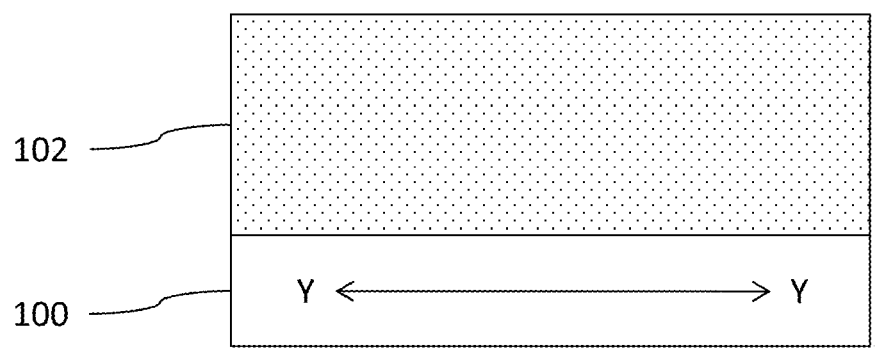
Figure 1C:
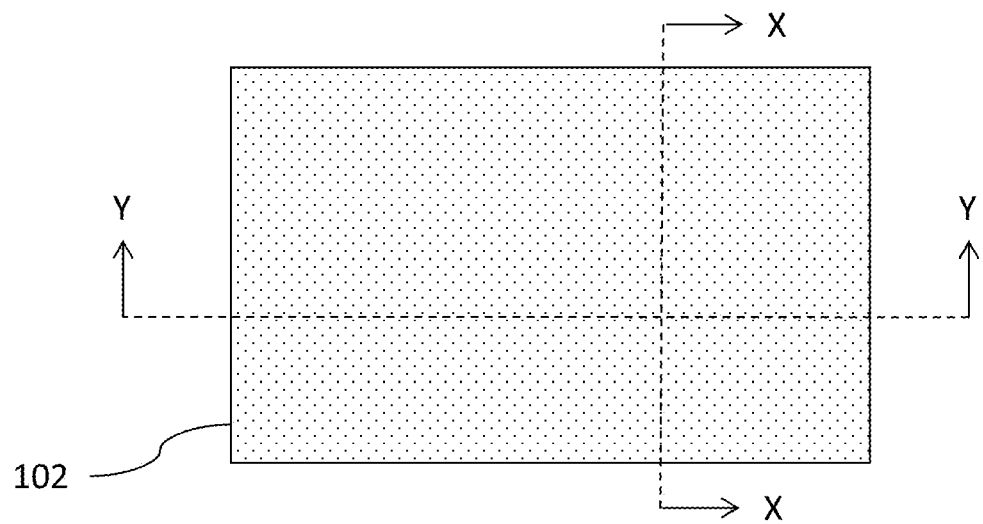

As shown in FIGS. 1A-1C, various exemplary methods herein perform processing that includes, but is not limited to, forming a semiconductor layer 102 on a substrate 100. The arbitrarily identified "bottom" (first side) of the semiconductor layer 102 is connected to the substrate 100 and the arbitrarily identified "top" (second side) of the semiconductor layer 102 is opposite the bottom. The semiconductor can be formed of silicon and later doped with an impurity, or can be deposited/grown to include semiconductor doping in situ.

Figure 2A:
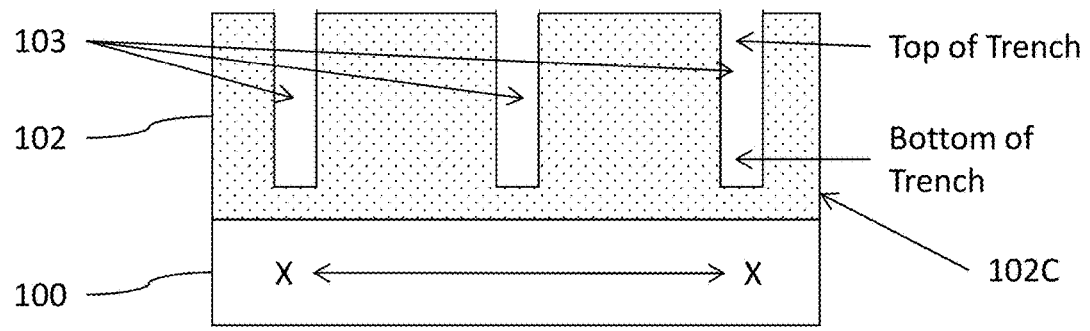
Figure 2B:
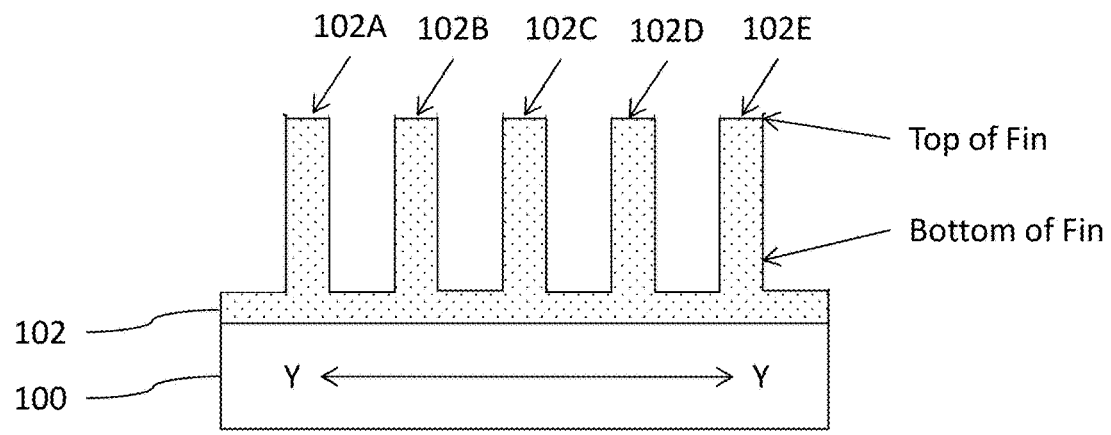
Figure 2C:
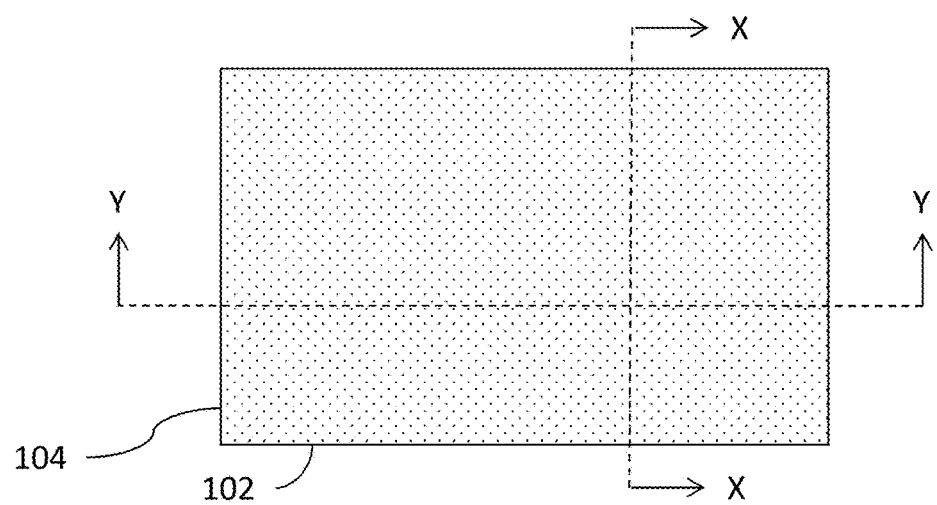

FIGS. 2A-2C illustrate that such methods pattern the semiconductor layer 102 to form at least one fin 102C extending toward the top of the semiconductor layer 102. This processing leaves the bottom of the semiconductor layer 102 as a continuous, unbroken structure, to allow the fins 102A-102E to extend from the bottom of the semiconductor layer 102.

Note that, while a limited number of fins 102A-102E are illustrated in the drawing, any number of fins 102A-102E can be formed, depending upon the specific design. Additionally, only a limited number of drawings accompanying this application identify the fins 102A-102E by number and arrow, to avoid clutter in the drawings. The top of the fin 102C is distal to where the bottom of the semiconductor layer 102 contacts the substrate 100. FIG. 2A also illustrate that such methods pattern each of the fins 102A-102E to form trenches 103. As shown, the trenches 103 extend from the top of the fin 102C and partially into the fin 102C (but not fully through the semiconductor layer 102; and, therefore, the trenches 103 only partially extend into the fin, and do not extend down through the semiconductor layer 102 to the substrate 100).

Figure 3A:
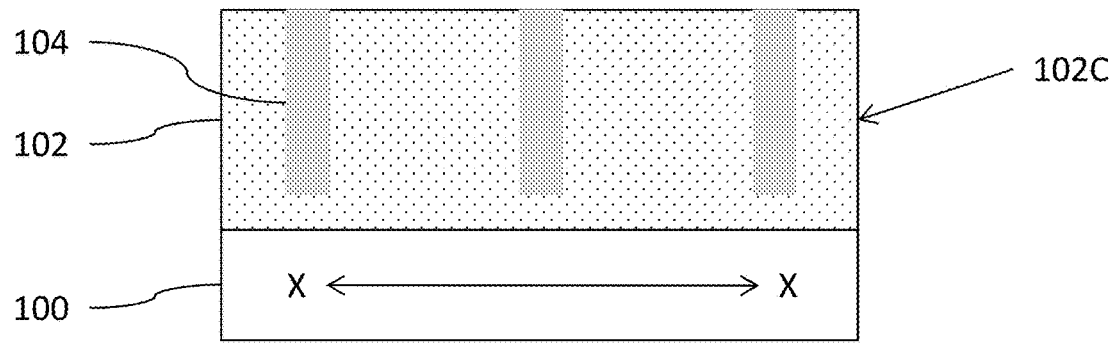
Figure 3B:
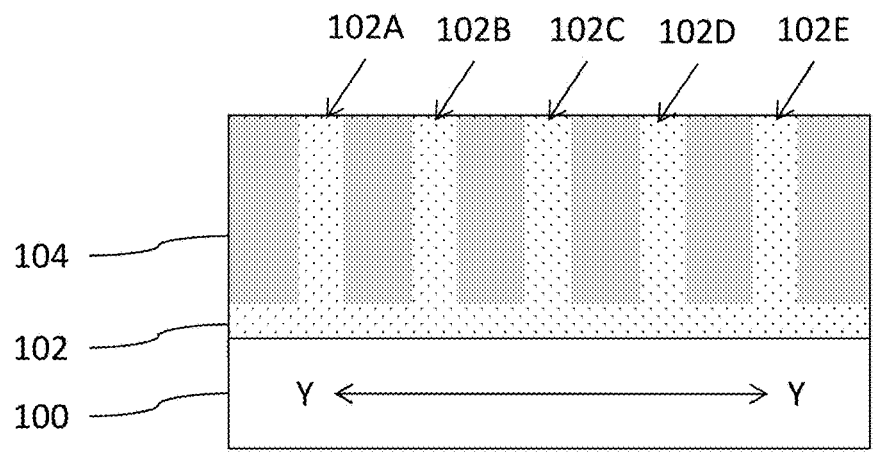
Figure 3C:
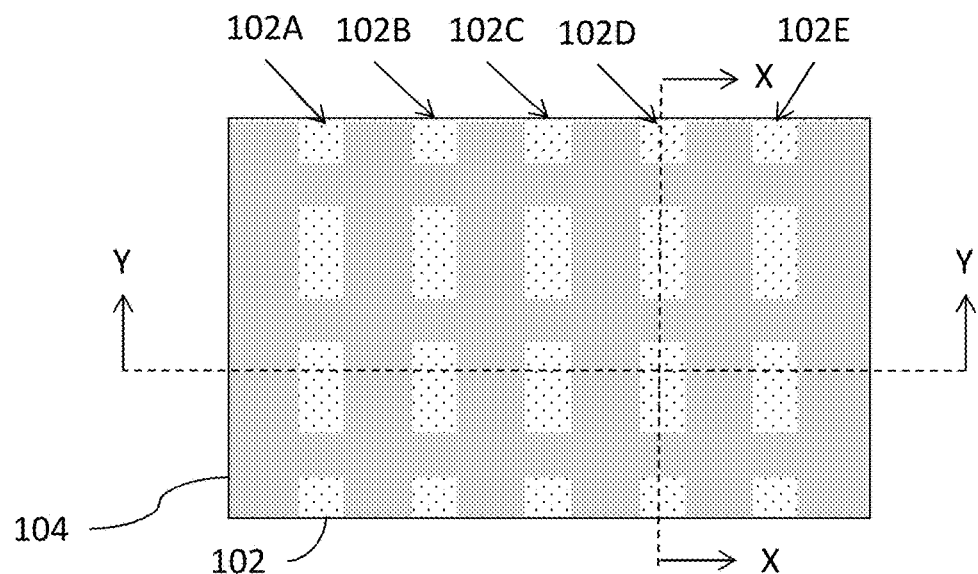
Figure 4A:
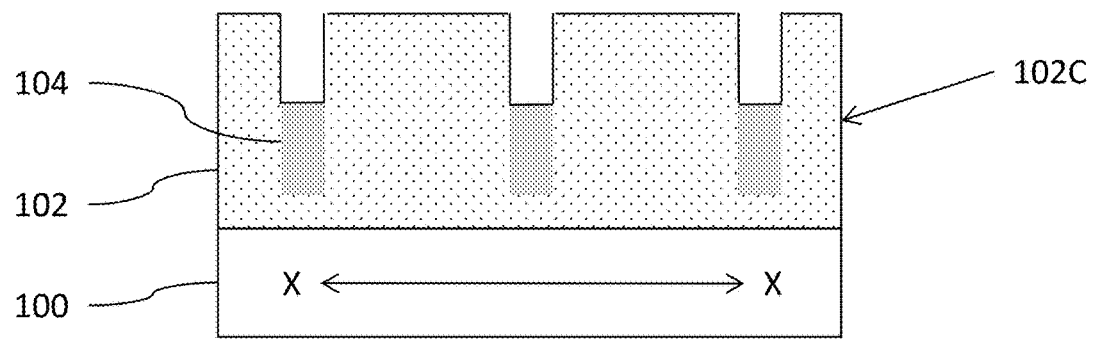
Figure 4B:
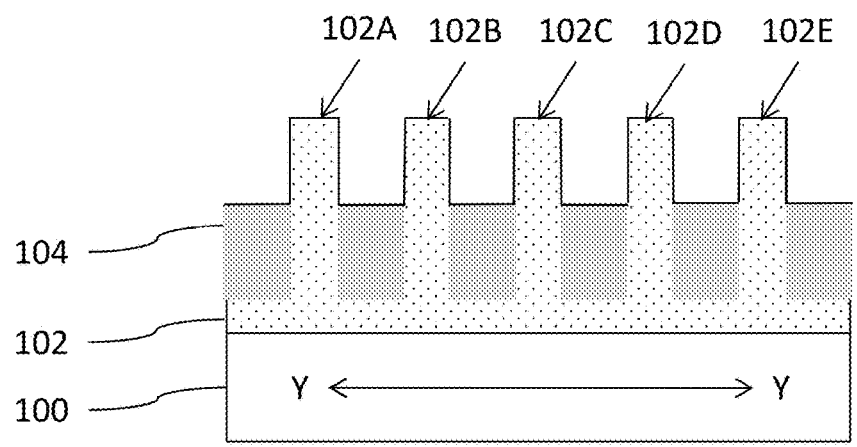
Figure 4C:
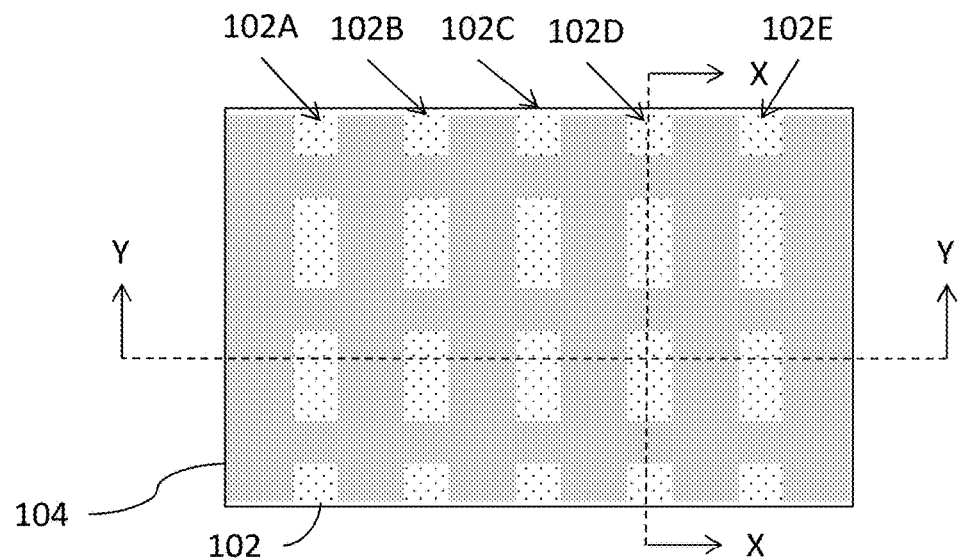

As shown in FIGS. 3A-3C, the methods herein form an insulator 104 (e.g., an oxide, etc.) in the trenches 103 and adjacent (between) the fins 102A-102E. More specifically, FIGS. 3A-3C illustrate the structure after an insulator deposition/growth process, and planarization process. Next, as shown in FIGS. 4A-4C these methods then remove a portion of the insulator 104 (e.g., through chemical oxide removal (COR), etc.) to reduce the thickness of the insulator 104 in the trenches 103 and between the fins 102A-102E. Thus, this processing removes the insulator 104 from the top of the trenches 103 (a first portion of trenches 103), but leaves the insulator 104 in the bottom of the trench 103 (and in areas between adjacent fins 102A-102E).

Figure 5A:
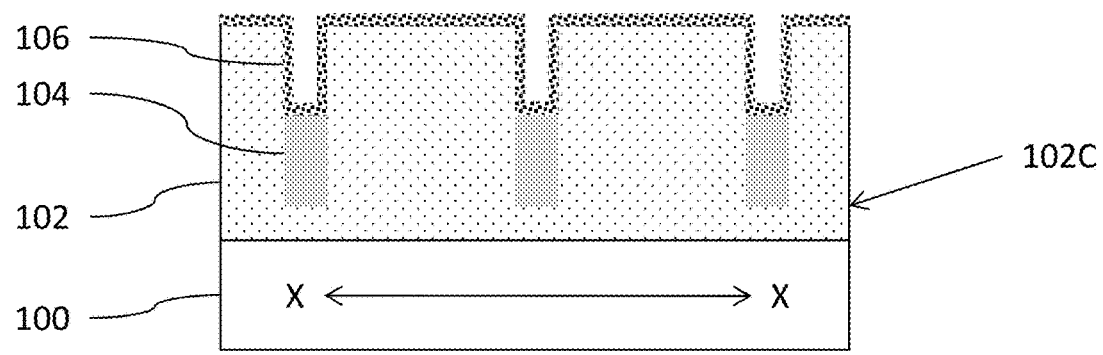
Figure 5B:
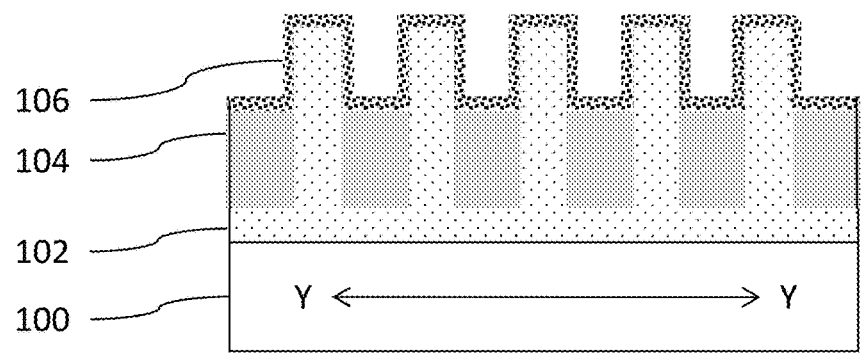
Figure 5C:
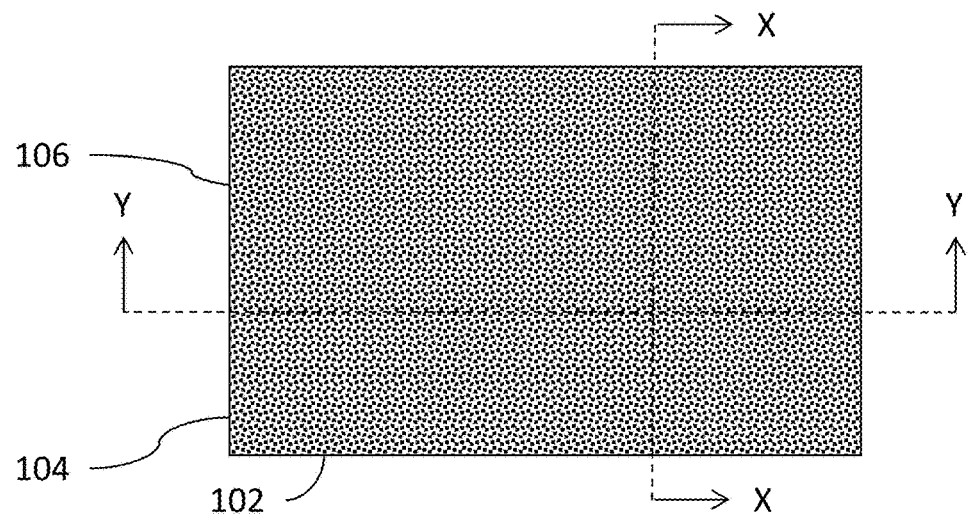

As shown in FIGS. 5A-5C, these methods also form a protective liner 106 (e.g., a nitride, etc.) that lines the tops of the trenches 103, the remainder of the insulator 104 in the bottom of the trenches 103, the top of the fin 102C, and the sides of the fin 102C that are not contacting the insulator 104. This protective liner 106 prevents subsequent processing from reducing the size of the fins 102A-102E to allow for easier alignment of features on the top of the fins 102A-102E, improves device performance by increasing the size of the semiconductor, and avoids short circuits by maintaining insulators of sufficient size to prevent the insulators from failing.

Figure 6A:
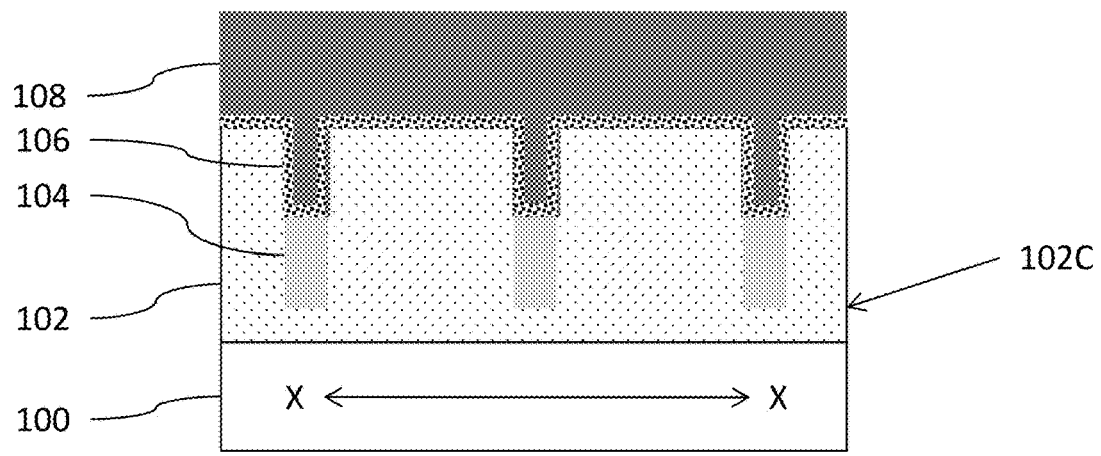
Figure 6B:
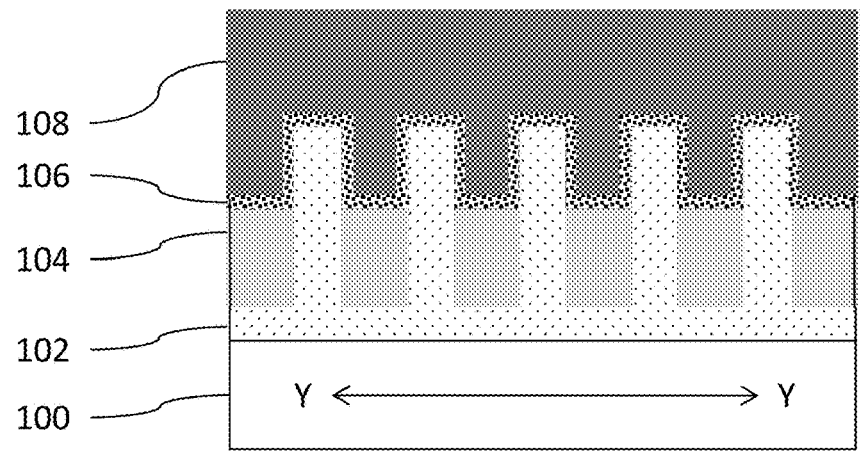
Figure 6C:
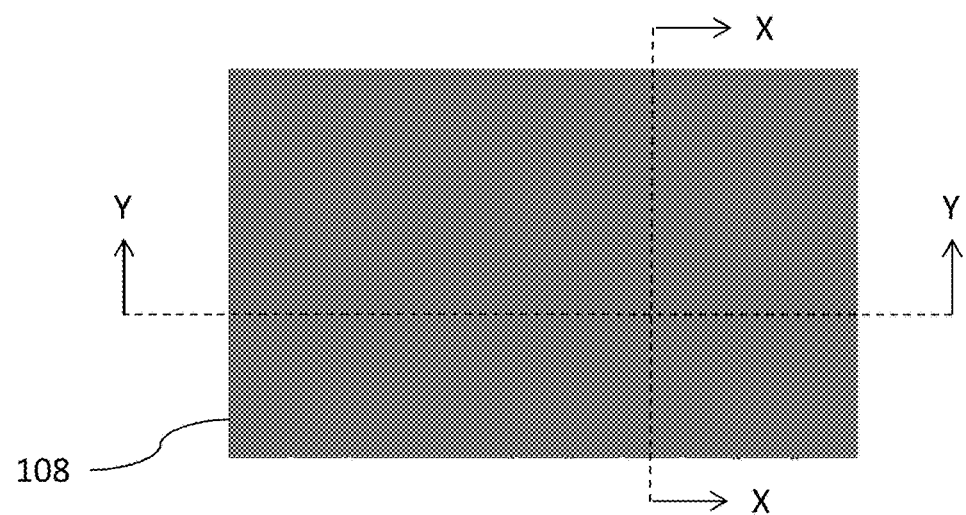
Figure 7A:
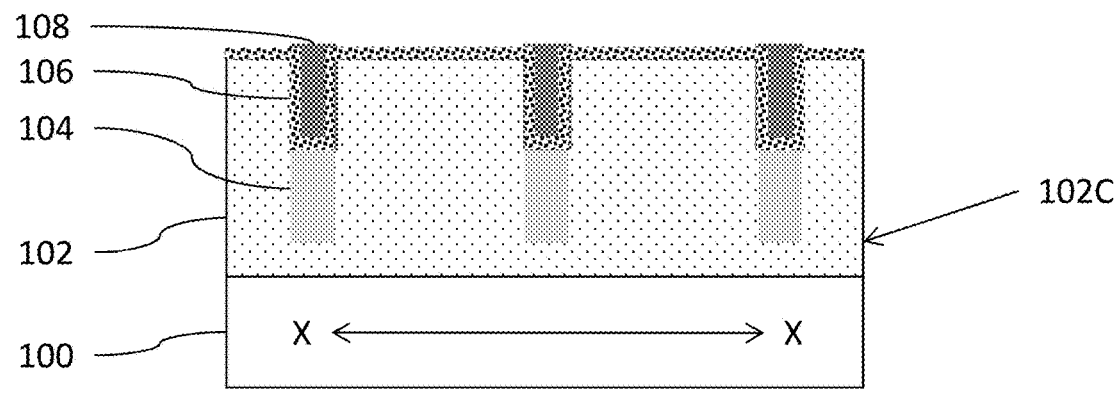
Figure 7B:
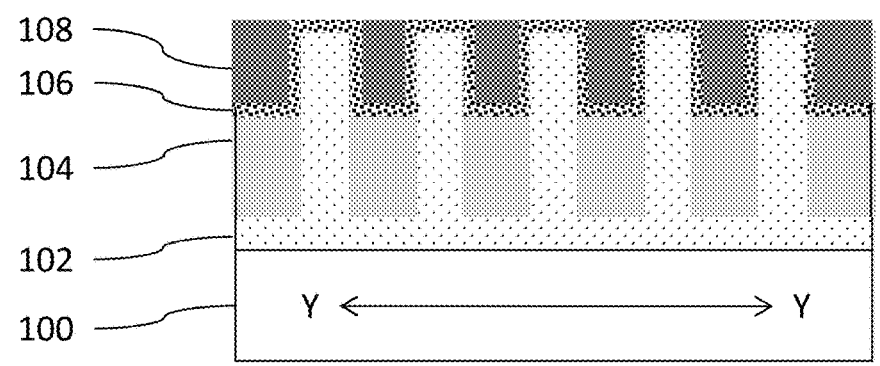
Figure 7C:
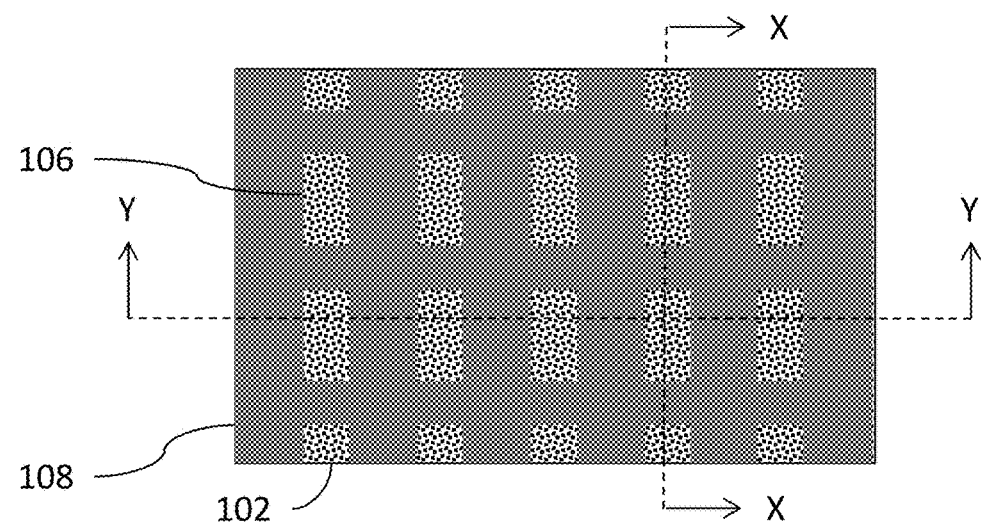
Figure 8A:
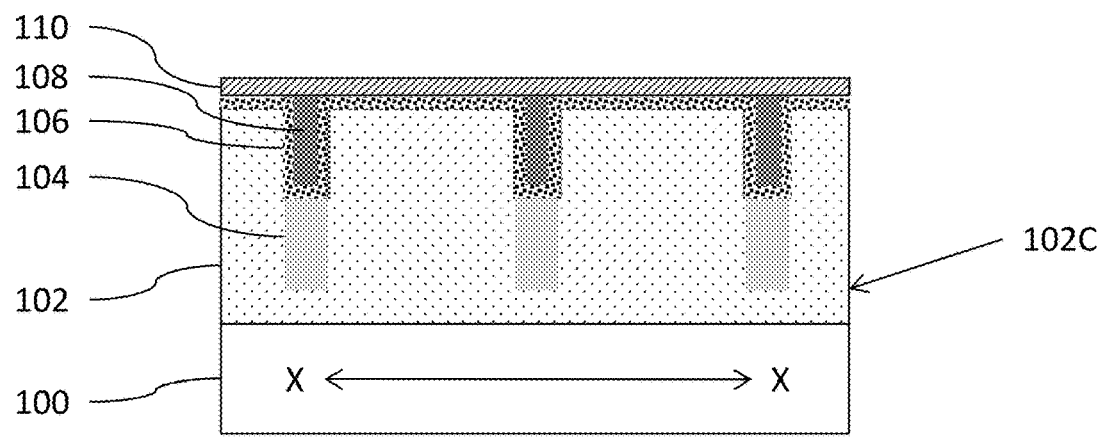
Figure 8B:
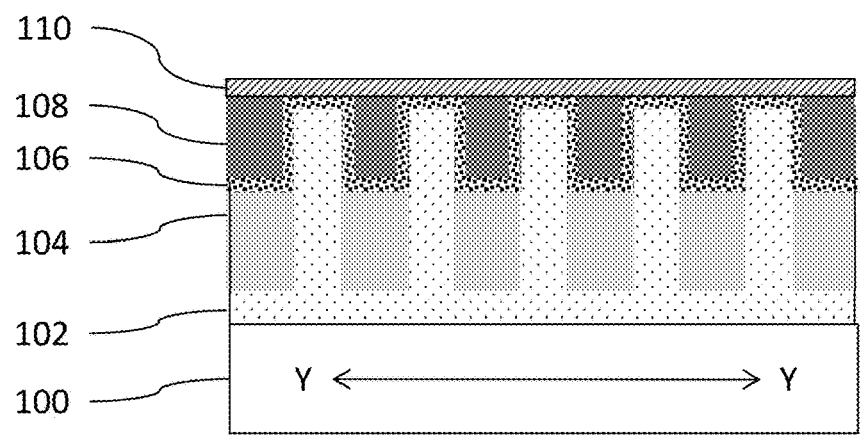
Figure 8C:
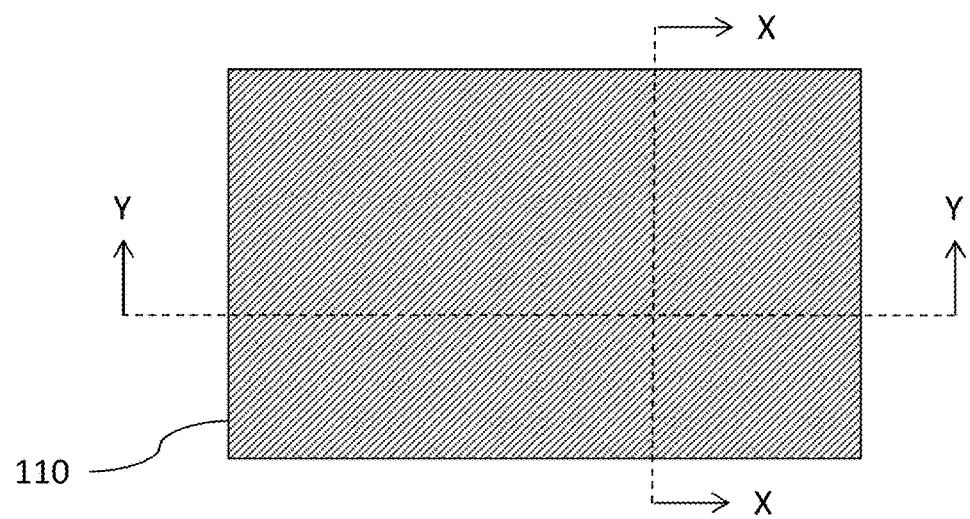

As shown in FIGS. 6A-6C, methods herein then form a hardmask 108 on the protective liner 106 (e.g., using spin-on-hardmask (SOH) processing, etc.) to fill the top of the trenches 103 (that are above the protective liner 106) with the hardmask 108. Then, as shown in FIGS. 7A-7C, these processes etch back the hardmask 108 down to the level of the protective liner 106 on the fin 102C to leave the hardmask 108 only in the trenches 103, and adjacent the sides of (between) the fins 102A-102E on the insulator 104. As shown in FIGS. 8A-8C, methods herein form a protective layer 110 (e.g., a nitride, etc.) on the top of the fin 102C and on the hardmask 108 in the trenches 103.

Figure 9A:
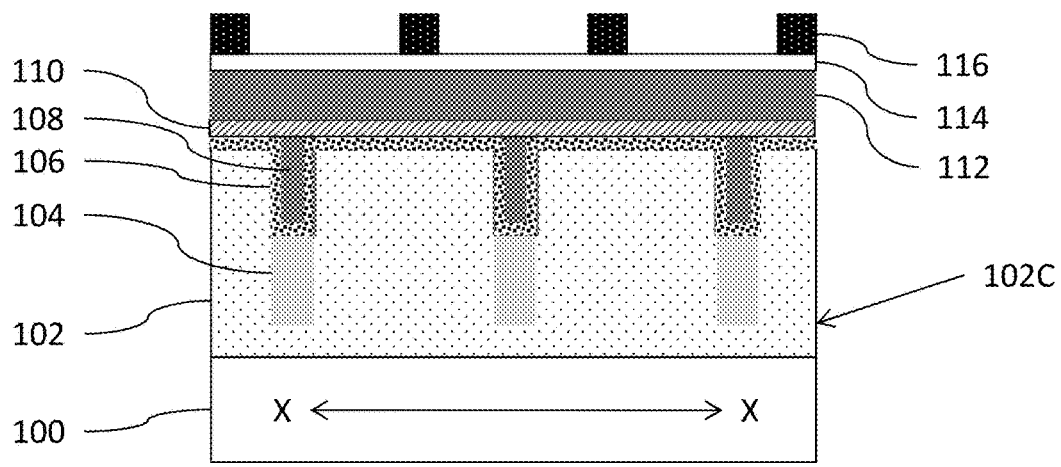
Figure 9B:
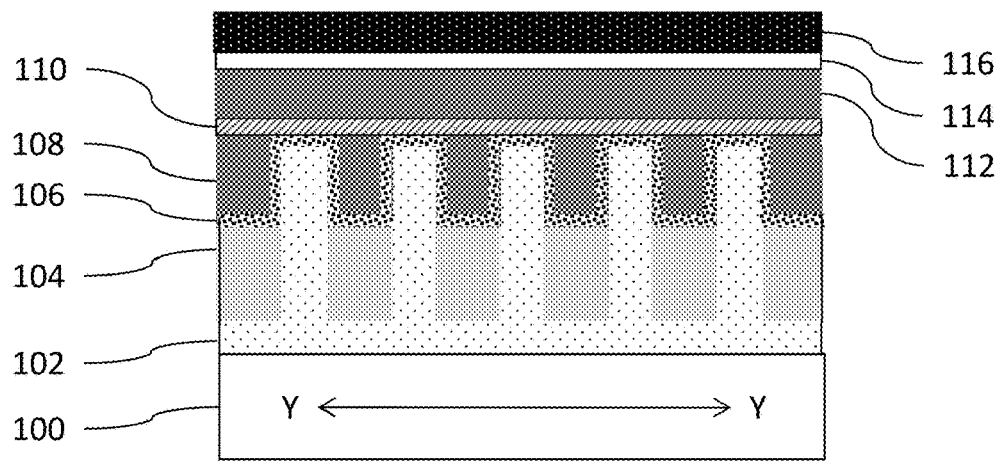
Figure 9C:
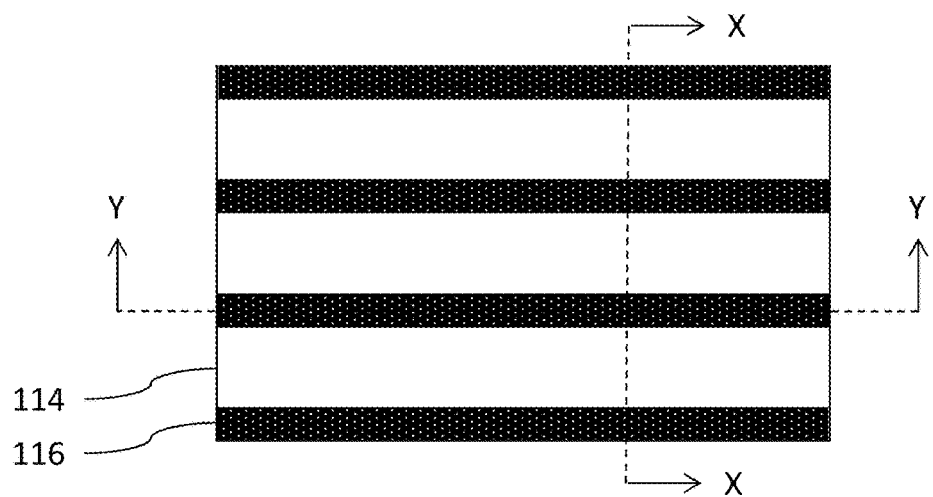
Figure 10A:
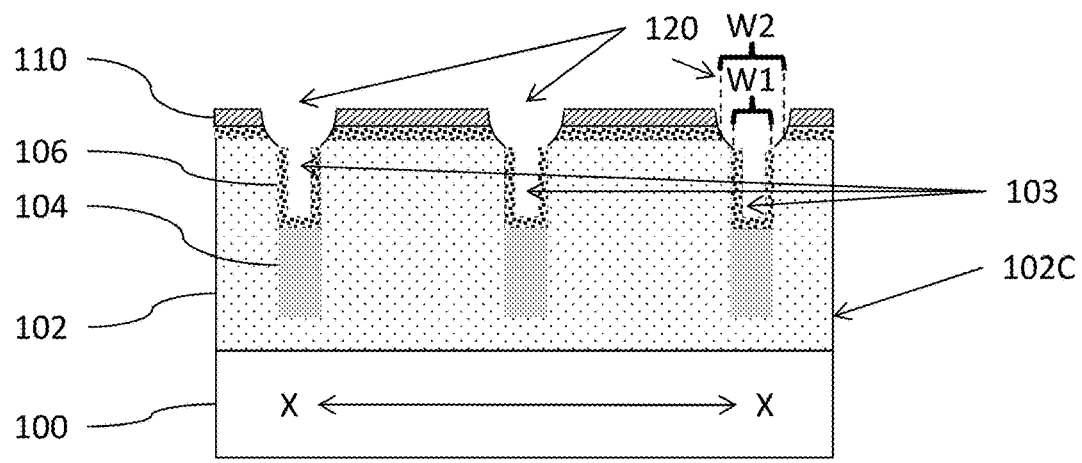
Figure 10B:
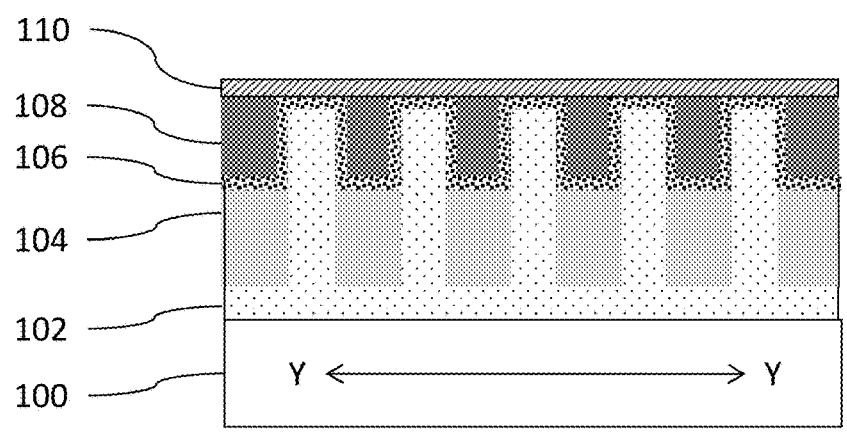
Figure 10C:
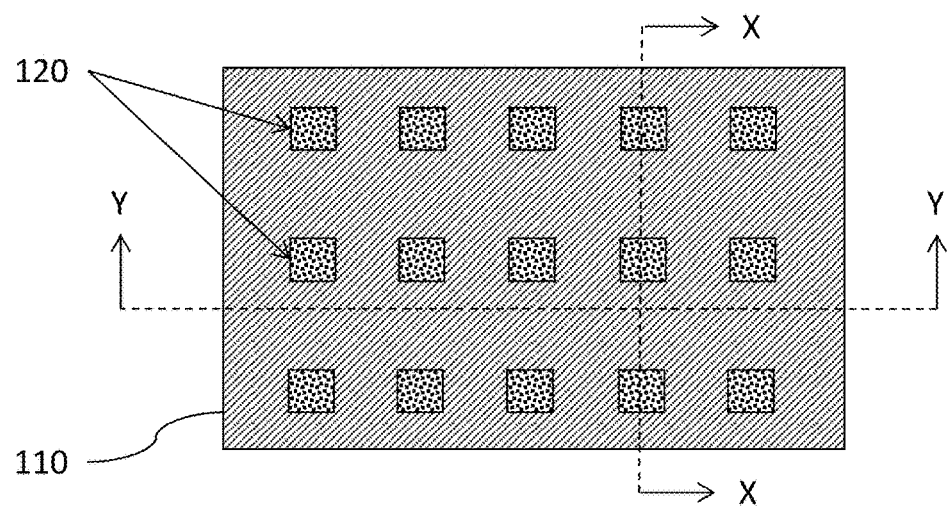

As shown in FIGS. 9A-9C and 10A-10C, methods herein then perform a patterned material removal process to remove a portion of the protective layer 110 covering the hardmask 108. More specifically, as shown in FIGS. 9A-9C, this processing successively forms a hardmask layer 112, a nitride layer 114, and patterns a photoresist layer 116. Then, as shown in FIGS. 10A-10C, this processing performs etching through the photoresist 116, nitride layer 114, and hardmask 112 to remove patterned portions of the hardmask 108 only from the trenches 103. Therefore, as shown in FIGS. 10A and 10C, this exposes the protective liner 106 where the trenches 103 in the fins 102A-102E are located, but leaves the hardmask 108 and protective layer 110 in other locations (on the tops of the fins 102A-102E, and between the fins 102A-102E, as shown in FIG. 10B), and this also leaves the protective liner 106 in the trenches 103.

Note that, as shown in FIG. 10A, this processing creates widened openings 120 at the tops of the trenches 103, where the widened openings 120 are shown to have a width of W2 that is wider relative to the width W1 of the remainder of the trench 103. This widened opening 120 is filled with an insulator (as discussed below) and the increased size of the insulator in the widened opening 120 prevents holes from forming in the diffusion break insulator, which helps prevent short circuits. The increased size of the insulator also helps the diffusion break insulate adjacent functional transistors from one another.

Figure 11A:
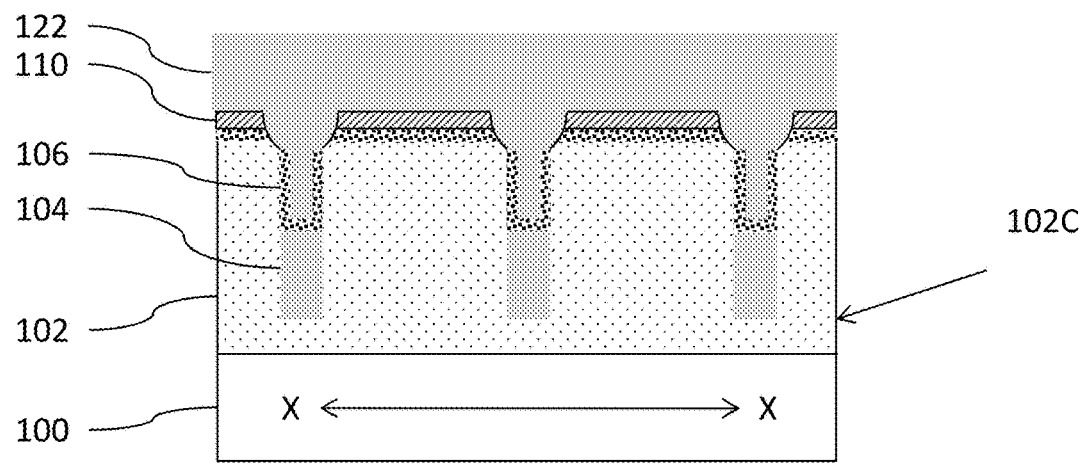
Figure 11B:
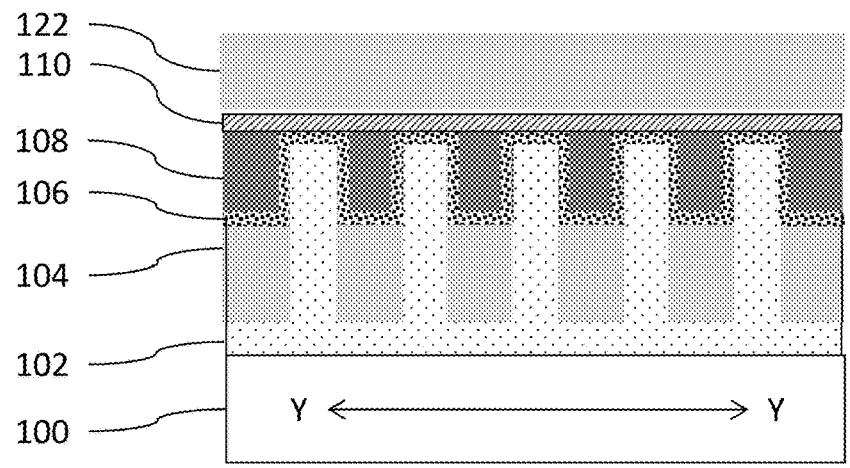
Figure 11C:
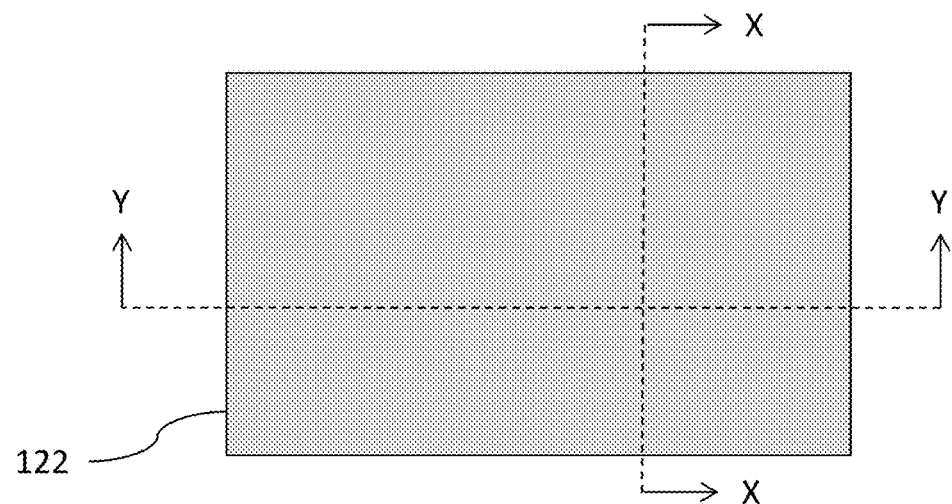
Figure 12A:
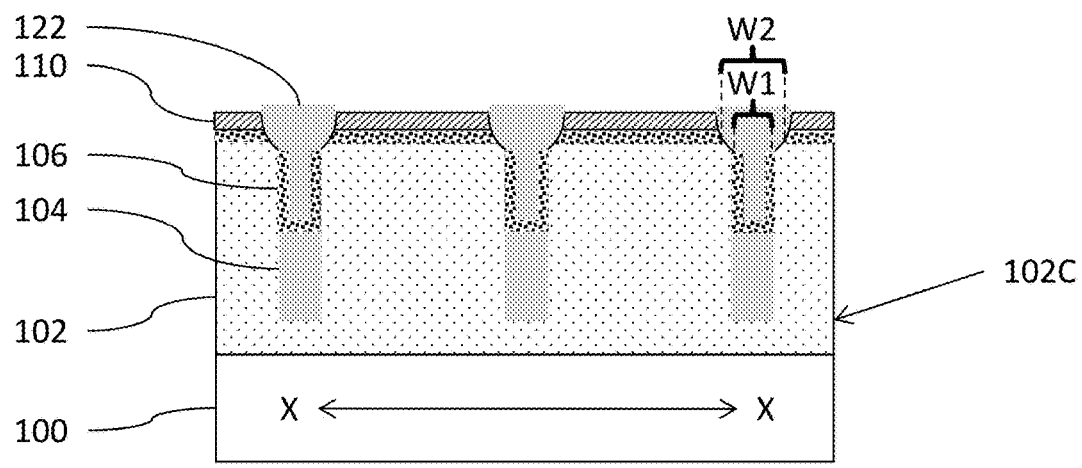
Figure 12B:
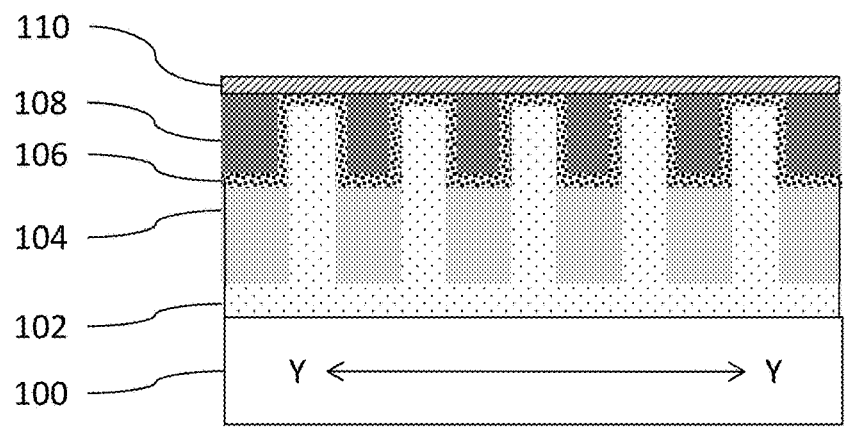
Figure 12C:
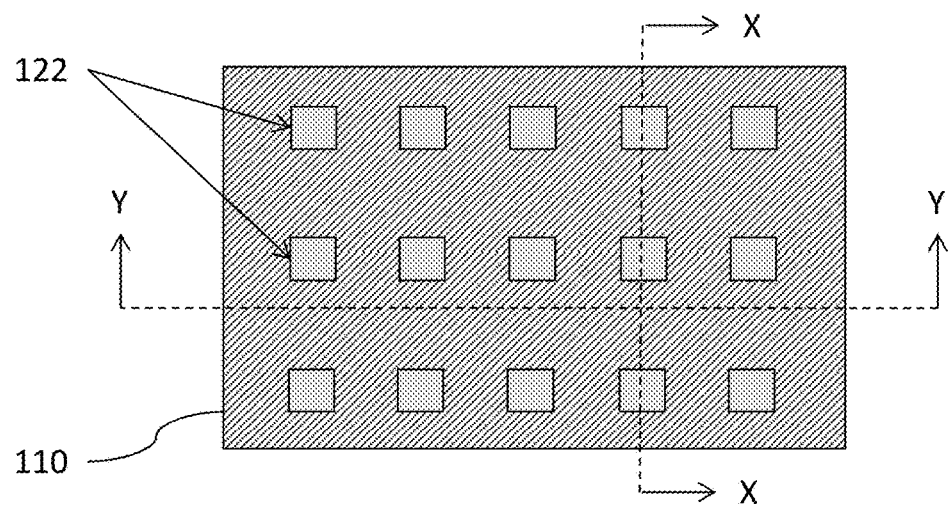

This allows these methods to form additional amounts of the insulator 122 (e.g., again an oxide) in the trenches 103 on the protective liner 106, and on the protective layer 110, as shown in FIGS. 11A-11C. This additional insulator 122 is then planarized (e.g., using chemical mechanical polishing (CMP), etc.) down to the protective layer 110, as shown in FIGS. 12A-12C, to remove portions of the insulator 104 that are distal to the top of the fins 102A-102E. Thus, the processing shown in FIGS. 11A-12C fills the top of the trenches 103 with the additional amounts of the insulator 122 (thereby forming the "first" portion of the insulator discussed above).

As can be seen in FIG. 12A, the protective liner 106 divides the insulator in the trench 103 into a first portion 122 and a second portion 104. In other words, the first portion 122 of the insulator in the trench 103 is between the top of the fin 102C and the second portion 104 in the bottom of the trench 103. As noted above, the patterned material removal process, shown in FIGS. 10A-10C, forms a widened section 120 in the trench 103 where the insulator 104 contacts the first and third gate stacks. As also shown in FIG. 12A, the insulator 122 in the widened section 120 is wider W2 than the second portion 104 of the insulator (W1).

Figure 13A:
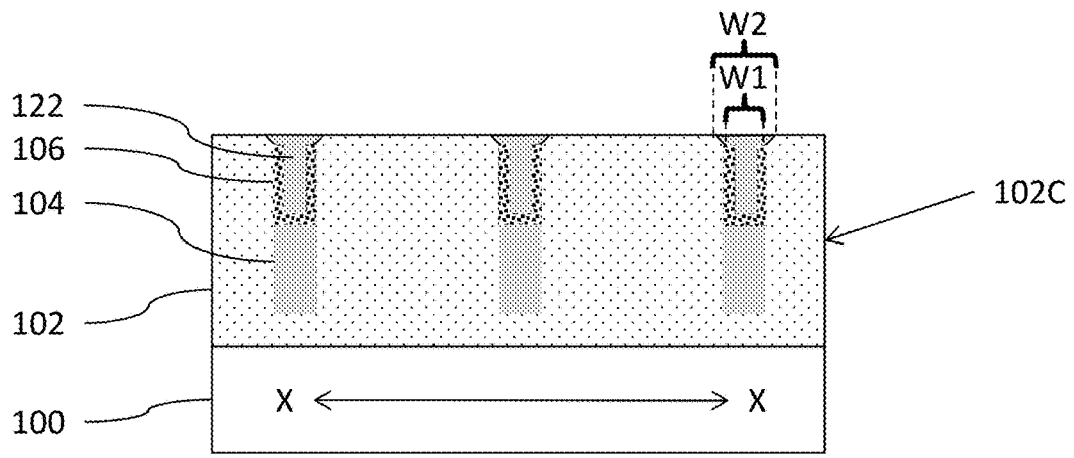
Figure 13B:
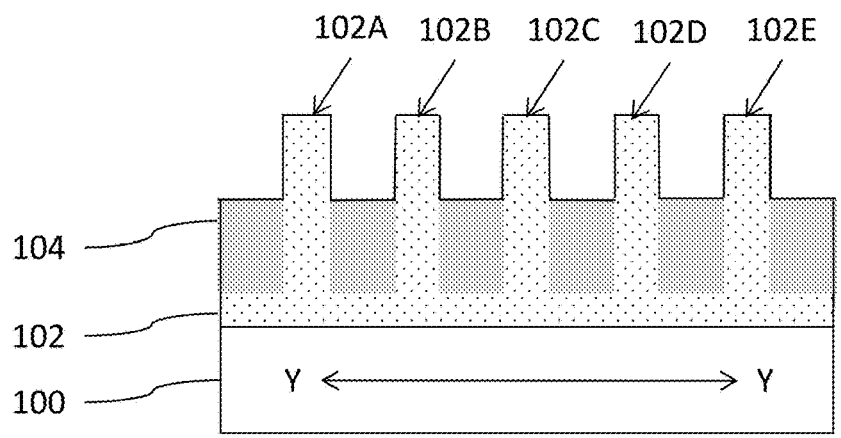
Figure 13C:
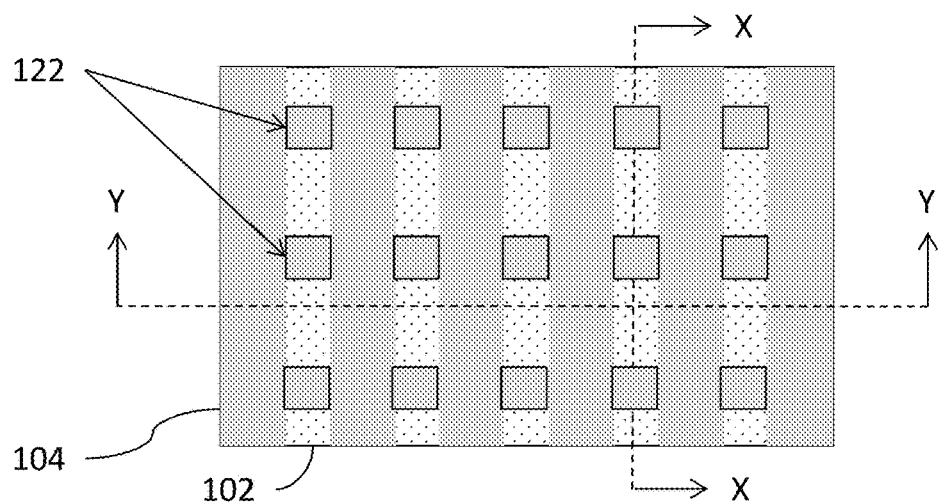

As shown in FIGS. 13A-13C, various processing (oxide deglaze, nitride strip, SOH strip, nitride strip, etc.) is performed to remove the protective layer 110, to remove the additional insulator 122 between the fins 102A-102E, and to remove portions of the protective liner 106 that are outside the trenches 103 (remove protective liner 106 that is on the top of, and between, the fins 102A-102E).

Figure 14A:
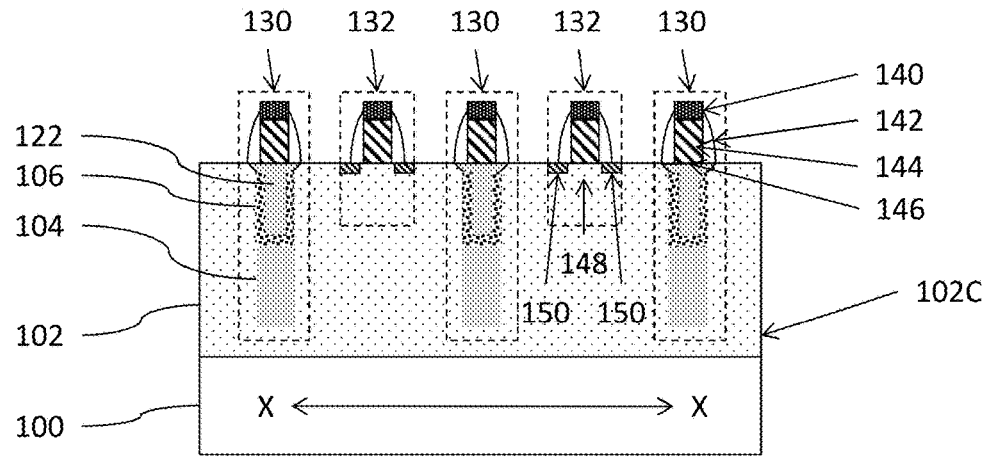
Figure 14B:
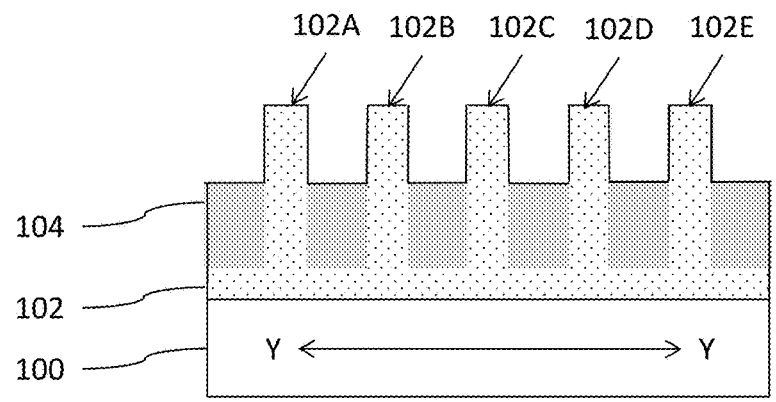
Figure 14C:
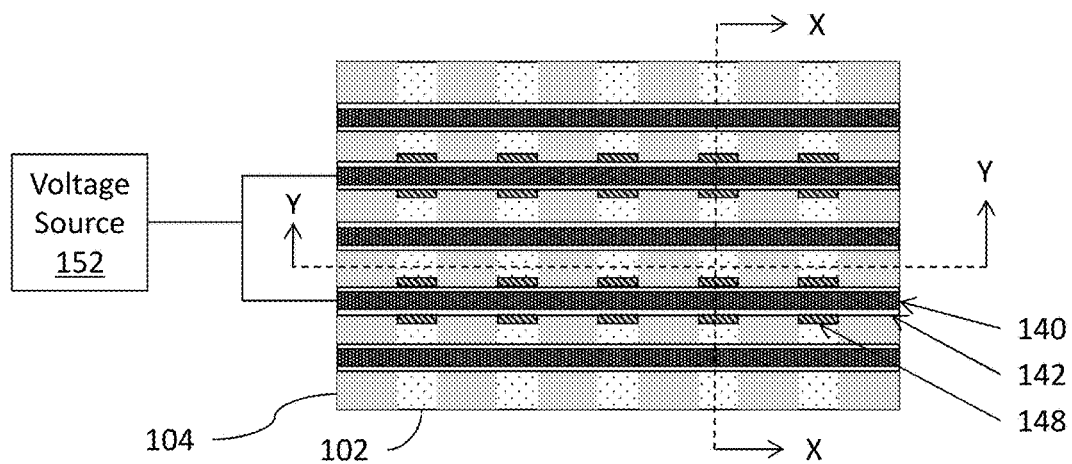

As shown in FIGS. 14A-14C, methods herein then form at least three gate stacks 140-146 contacting, and spaced along the top of the fin 102C. Each of the gate stacks includes a hardmask cap (e.g., nitride) 140, connected to which is a gate conductor (metal, polysilicon, etc.) 144, and connected to that is a gate insulator (e.g., oxide) 146; and spacers 142 (e.g., nitride, oxide, etc.) on the sidewalls of the foregoing elements. Any conventional gate stack formation processing can be use, whether currently known, or developed in the future to form the gate stacks 104-146. Additional processing forms source and drain regions 150 in the fins 102A-102E (potentially using the gate stack as a self-alignment aid).

The source and drain 150 regions, and the semiconductor portion of the fin 102C that contacts an arbitrarily designated "second" of such gate stacks 140-146, form functional transistors 132. In contrast, arbitrarily designated "first" and "third" gate stacks 140-146 and the insulator 104, connected to the first and third gate stacks 140-146, form non-functional diffusion breaks 130 on opposite sides of the functional transistors 132. The non-functional transistors 130 are diffusion breaks that insulate functional transistors 132 from one another.

The first and third of such gate stacks 140-146 (of the non-functional diffusion breaks 130) are on the insulator 122 in the trenches 103, but the second of such gate stacks 140-146 (of the functional transistors 132) are formed on the semiconductor material of the fin 102C which becomes the channel region 148 of the functional transistors 130, between the first and third gate stacks 140-146 (of the non-functional diffusion breaks 130). Note that the processing only forms the source and drain regions 150 in the fin 102C adjacent the second of such gate stacks 140-146 (of the functional transistors 132).

Therefore, a second conductive gate 144 of the second gate stacks 140-146 (of the functional transistors 132) are connectable to a voltage source 152; however, first and third conductive gates 144 of the first and third gate stacks 140-146 (of the non-functional diffusion breaks 130) are insulated from voltage source 152s. These non-functional diffusion breaks 130 insulate the functional transistor 132 from other structures.

Note that the processing discussed above (shown in FIGS. 13A-13C) that planarizes the additional insulator 122 down to the top of the fins 102A-102E, forms the surface of the insulator 122 contacting the first and third gate stacks 140-146 (of the non-functional diffusion breaks 130) to be coplanar with the top of the fin 102C. As shown, such processing also forms portions where the insulator 122 contacts the first and third gate stacks 140-146 (of the non-functional diffusion breaks 130), and where the second gate stack 140-146 (of the functional transistors 132) contacts the fin 102C, to all be within a single plane.

Such methods produce various integrated circuit structures as shown, for example, in FIGS. 14A-14C that include (among other components) a semiconductor layer 102 having a bottom connected to a substrate 100. The semiconductor layer 102 has at least one fin 102C extending toward the top of the semiconductor layer 102, that is opposite the bottom. Again, the top of the fin 102C is distal to where the bottom of the semiconductor layer 102 contacts the substrate 100.

As noted above, at least three gate stacks 140-146 contact, and are spaced along, the top of the fin 102C. Each of the gate stacks includes a hardmask cap (e.g., nitride) 140, connected to which is a gate conductor (metal, polysilicon, etc.) 144, and connected to that is a gate insulator (e.g., oxide) 146. Further, spacers 142 (e.g., nitride, oxide, etc.)

are on the sidewalls of the foregoing elements. Source and drain regions 150 are in the fin 102C.

Second gate stacks 140-146 (of the functional transistors 132) are between the first and third gate stacks 140-146 (of the non-functional diffusion breaks 130) along the top of the fin 102C. The second gate stacks 140-146, the source and drain 150 regions, and a semiconductor portion of the fin 102C that contacts the gate stack form the functional transistors 132. However, the first and third gate stacks 140-146 (of the non-functional diffusion breaks 130), and the insulator 104 connected to the first and third gate stacks 140-146, form the non-functional diffusion breaks. Thus, a second conductive gate of the second gate stack 140-146 (of the functional transistors 132) are connected to a voltage source 152, and first and third conductive gates 144 of the first and third gate stacks 140-146 (of the non-functional diffusion breaks 130) are insulated from voltage sources 152. These diffusion breaks 130 are on opposite sides of the functional transistors 132, and insulate the functional transistors 132 from each other, and from other structures.

An insulator 104 in trenches 103 in the fin 102C contacts the first and third of the gate stacks 140-146 (of the non-functional diffusion breaks 130). The trenches 103 containing the insulator 104 extend into the fin 102C from the first and third gate stacks 140-146 (of the non-functional diffusion breaks 130) toward the bottom of the semiconductor layer 102. Additionally, the protective liner 106 is in the trenches 103 between the top (first) portion of the insulator 122 and a bottom (second) portion of the insulator 104. Thus, the top portion of the insulator 122 in the trench 103 is between the first and third gate stacks 140-146 (of the non-functional diffusion breaks 130) and the bottom portion of the insulator 104. Also, the trenches 103 and insulator 122 include a widened section 120 where the insulator 122 contacts the first and third gate stacks 140-146 (of the non-functional diffusion breaks 130), and the widened section 120 is wider W2 than the bottom portion 104 of the trenches 103 and insulator 104 (W1) and promotes proper contact between the insulator 104, 122 and the first and third gate stacks 140-146 (of the non-functional diffusion breaks 130).

For example, the insulator 104/122 can be an oxide, and the protective liner 106 can be a nitride liner 106. The surface of the insulator 122 contacting the first and third gate stacks 140-146 (of the non-functional diffusion breaks 130) is coplanar with the top of the fin 102C. Further, portions where the insulator 122 contacts the first and third gate stacks 140-146 (of the non-functional diffusion breaks 130), and where the second gate stacks 140-146 (of the functional transistors 132) contacts the fin 102C are within a single plane. As noted above, the source and drain 150 regions in the fin 102C are only adjacent a second of the gate stacks 140-146 (of the functional transistors 132).

Figure 15:
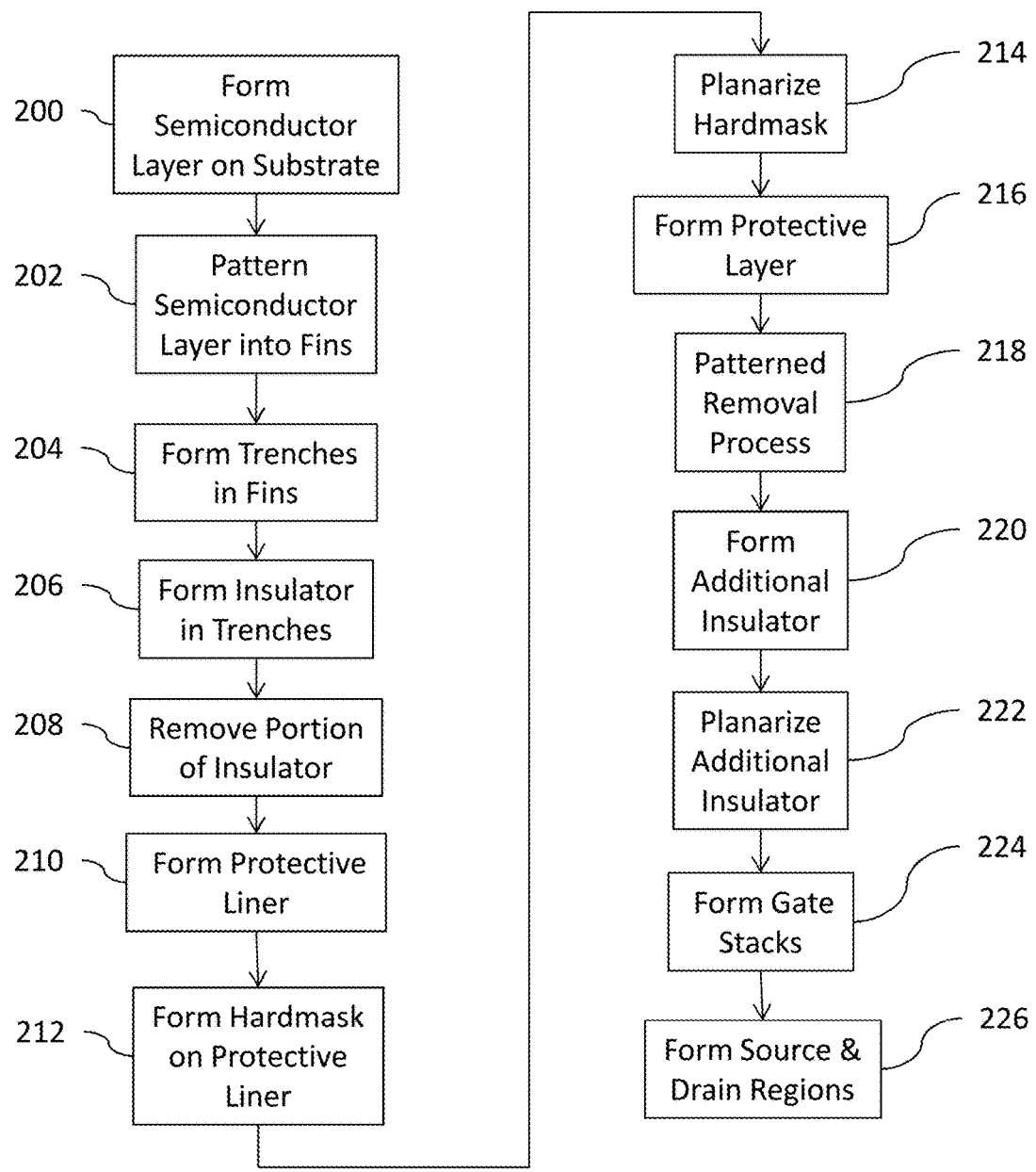
FIG. 15 is a flow diagram illustrating embodiments herein.

As shown in flowchart form in FIG. 15, methods herein perform processing that includes, but is not limited to forming a semiconductor layer on a substrate 200. In item 200, the bottom (first side) of the semiconductor layer is formed to be connected to the substrate, and the top (second side) of the semiconductor layer is opposite the bottom. In item 202, such methods pattern the semiconductor layer to form at least one fin extending toward the top of the semiconductor layer. Again, the top of the fin is distal to where the bottom of the semiconductor layer contacts the substrate.

Such methods pattern the fin to form trenches in item 204. The trenches extend from the top of the fin into the fin. In item 206, the methods herein form an insulator in the trenches and adjacent the fin, and then remove a portion of the insulator to reduce the thickness of the insulator in item 208. Thus, this processing in item 208 removes the insulator from the top of the trenches (a first portion of trenches), but leaves the insulator in the bottom of the trench (and in areas adjacent the fin and between adjacent fins).

These methods also form a protective liner in item 210 that lines the tops of the trenches, the remainder of the insulator in the bottom of the trenches, the top of the fin, and the sides of the fin that are not contacting the insulator. For example, the insulator can be an oxide, and the protective liner can be a nitride liner. In item 212, methods herein then form a hardmask on the protective liner to fill the top of the trenches that are above the protective liner with the hardmask. Then, in item 214, these processes planarize the hardmask down to the level of the protective liner on the fin to leave the hardmask in the trenches and adjacent the sides of the fins. As shown in item 216, methods herein form a protective layer on the top of the fin and on the hardmask in the trenches.

In item 218, methods herein then perform a patterned material removal process to remove a portion of the protective layer covering the hardmask, to remove the hardmask from the trenches, and to leave the protective liner in the trenches. This allows these methods to form additional amounts of the insulator in the trenches on the protective liner, and on the protective layer, in item 220; and this fills the top of the trenches with the additional amounts of the insulator.

Thus, the protective liner divides the insulator in the trench into a first portion and a second portion. In other words, the first portion of the insulator in the trench is between the top of the fin and the second portion in the bottom of the trench. The patterned material removal process in item 218 also forms a widened section in the trench where the insulator contacts the first and third gate stacks. The widened section is wider than the second portion of the insulator. Additional processing in item 222 planarizes the insulator down to the top of the fin to remove portions of the insulator that are distal to the top of the fin, and to remove the protective layer.

In item 224, methods herein then form at least three gate stacks contacting, and equally spaced along the top of the fin. The first and third of such gate stacks are formed on the insulator in the trenches, and a second of such gate stacks is formed on the semiconductor material of the fin, between the first and third gate stacks. Additional processing in item 226 forms source and drain regions in the fin only adjacent the second gate stack. The process of planarizing the insulator down to the top of the fin in item 222 forms the surface of the insulator contacting the first and third gate stacks to be coplanar with the top of the fin. Such processing in item 222 also forms portions where the insulator contacts the first and third gate stacks, and where the second gate stack contacts the fin, to all be within a single plane.

The source and drain regions, and the semiconductor portion of the fin that contacts the gate stack form a functional transistor. In contrast, the first and third gate stacks and the insulator connected to the first and third gate stacks form non-functional diffusion breaks on opposite sides of the functional transistor. Therefore, a second conductive gate of the second gate stack is connectable to a voltage source; however, first and third conductive gates of the first and third gate stacks are insulated from voltage sources. These non-functional diffusion breaks insulate the functional transistor from other structures.

As noted above, the protective liner 106 prevents subsequent processing from reducing the size of the fins 102A-102E to allow for easier alignment of features on the top of the fins 102A-102E, improves device performance by increasing the size of the semiconductor, and avoids short circuits by maintaining insulators of sufficient size to prevent the insulators from failing. Additionally, the widened opening 120 is filled with the insulator 122, and the increased size of the insulator 122 in the widened opening 120 prevents holes from forming in the diffusion break insulator 122, which helps prevent short circuits. The increased size of the insulator 122 also helps the diffusion break insulate adjacent functional transistors 132 from one another.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam, and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum, or gallium, etc., within an intrinsic semiconductor substrate (to create deficiencies of valence electrons) as a semiconductor region. Similarly, an "N-type transistor" is a negative-type transistor that uses impurities such as antimony, arsenic, or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, Si, SiC, SiGe, SiGeC, other III-V or II-VI compound semiconductors, or organic semiconductor structures, etc. A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit structure comprising:
   a substrate;
   a semiconductor layer comprising a first side connected to the substrate, wherein the semiconductor layer has at least one fin extending toward a second side of the semiconductor layer, opposite the first side;
   at least three gate stacks contacting, and spaced along, a top of the fin, wherein the top of the fin is distal to where the first side of the semiconductor layer contacts the substrate;
   an insulator in trenches in the fin contacting first and third gate stacks of the gate stacks, wherein the insulator extends into the fin from the first and third gate stacks toward the first side of the semiconductor layer;
   source and drain regions in the fin adjacent a second gate stack of the gate stacks, the second gate stack is between the first and third gate stacks along the top of the fin; and
   a protective liner positioned along first portions of sides of the trenches between the insulator and the semiconductor layer, wherein the protective liner divides the insulator into a first portion and a second portion, wherein the first portion is between the first and third gate stacks and the second portion,
   wherein the protective liner is positioned between the first portion of the insulator and the first portions of the sides of the trenches, and is positioned between the first portion of the insulator and the second portion of the insulator, and
   wherein the second portion of the insulator contacts second portions of the sides of the trenches that are distal to the first and third gate stacks.

2. The integrated circuit structure according to claim 1, wherein the insulator includes a widened section where the insulator contacts the first and third gate stacks, and the widened section is wider than the second portion of the insulator.

3. The integrated circuit structure according to claim 1, wherein a surface of the insulator contacting the first and third gate stacks is coplanar with the top of the fin.

4. The integrated circuit structure according to claim 1, wherein portions where the insulator contacts the first and third gate stacks, and where the second gate stack contacts the fin are within a single plane.

5. The integrated circuit structure according to claim 1, wherein the insulator comprises an oxide, and the protective liner comprises a nitride liner.

6. The integrated circuit structure according to claim 1, wherein the second gate stack, the source and drain regions, and a portion of the fin that contacts the second gate stack form a functional transistor, and wherein the first and third gate stacks and the insulator connected to the first and third gate stacks form non-functional diffusion breaks on opposite sides of the functional transistor that insulate the functional transistor from other structures.

7. The integrated circuit structure according to claim 1, wherein a second conductive gate of the second gate stack is connected to a voltage source, and first and third conductive gates of the first and third gate stacks are insulated from voltage sources.

8. A method of forming an integrated circuit structure, the method comprising:
   patterning a semiconductor layer to form at least one fin extending away from a substrate connected to the semiconductor layer, wherein a top of the fin is distal to where the semiconductor layer contacts the substrate;
   patterning the fin to form trenches in the fin;
   partially filling the trenches with an insulator;
   forming a protective liner on the insulator in the trenches;
   forming a hardmask on the protective liner to fill the trenches with the hardmask;
   planarizing the hardmask down to a level of the protective liner on the fin to leave the hardmask at least in the trenches;
   forming a protective layer on the top of the fin and on the hardmask in the trenches;
   performing a patterned material removal process to remove a portion of the protective layer covering the hardmask, to remove the hardmask from the trenches, and to leave the protective liner in the trenches;
   forming additional amounts of the insulator on the protective liner and the protective layer to fill the trenches with the additional amounts of the insulator, wherein the protective liner divides the insulator into a first portion and a second portion;
   planarizing the insulator down to the top of the fin to remove the protective layer;
   forming at least three gate stacks contacting, and spaced along, the top of the fin, wherein first and third gate stacks of the gate stacks are formed on the insulator in the trenches, and a second gate stack of the gate stacks is formed on the fin between the first and third gate stacks; and
   forming source and drain regions in the fin adjacent the second gate stack.

9. The method of forming the integrated circuit structure according to claim 8, wherein the patterned material removal process forms a widened section in the trenches where the insulator contacts the first and third gate stacks, and the widened section is wider than the second portion of the insulator.

10. The method of forming the integrated circuit structure according to claim 8, wherein the planarizing of the insulator down to the top of the fin forms a surface of the insulator contacting the first and third gate stacks to be coplanar with the top of the fin.

11. The method of forming the integrated circuit structure according to claim 8, wherein the planarizing of the insulator down to the top of the fin forms portions where the insulator contacts the first and third gate stacks, and where the second gate stack contacts the fin to be within a single plane.

12. The method of forming the integrated circuit structure according to claim 8, wherein the insulator comprises an oxide, and the protective liner comprises a nitride liner.

13. The method of forming the integrated circuit structure according to claim 8, wherein the second gate stack, the source and drain regions, and a portion of the fin that contacts the second gate stack form a functional transistor, and
   wherein the first and third gate stacks and the insulator connected to the first and third gate stacks form non-functional diffusion breaks on opposite sides of the functional transistor that insulate the functional transistor from other structures.

14. The method of forming the integrated circuit structure according to claim 8, wherein a second conductive gate of the second gate stack is connectable to a voltage source, and first and third conductive gates of the first and third gate stacks are insulated from voltage sources.

15. A method of forming an integrated circuit structure, the method comprising:
   forming a semiconductor layer on a substrate, wherein a first side of the semiconductor layer is connected to the substrate and a second side of the semiconductor layer is opposite the first side;
   patterning the semiconductor layer to form at least one fin extending toward the second side of the semiconductor layer, wherein a top of the fin is distal to where the first side of the semiconductor layer contacts the substrate;
   patterning the fin to form trenches extending from the top of the fin into the fin;
   forming an insulator in the trenches and adjacent the fin;
   removing a portion of the insulator to reduce a thickness of the insulator, and remove the insulator from a first portion of trenches, and from areas adjacent the fin;
   forming a protective liner on a remainder of the insulator in the trenches, on the top of the fin, and on sides of the fin not contacting the insulator;
   forming a hardmask on the protective liner to fill the trenches with the hardmask;
   planarizing the hardmask down to a level of the protective liner on the fin to leave the hardmask at least in the trenches;
   forming a protective layer on the top of the fin and on the hardmask in the trenches;
   performing a patterned material removal process to remove a portion of the protective layer covering the hardmask, to remove the hardmask from the trenches, and to leave the protective liner in the trenches;
   forming additional amounts of the insulator on the protective liner and the protective layer to fill the trenches with the additional amounts of the insulator, wherein the protective liner divides the insulator into a first portion and a second portion, and the first portion is between the top of the fin and the second portion;
   planarizing the insulator down to the top of the fin to remove portions of the insulator distal to the top of the fin, and to remove the protective layer;
   forming at least three gate stacks contacting, and spaced along, the top of the fin, wherein first and third gate stacks of the gate stacks are formed on the insulator in the trenches, and a second gate stack of the gate stacks is formed on the fin between the first and third gate stacks; and
   forming source and drain regions in the fin adjacent the second gate stack.

16. The method of forming the integrated circuit structure according to claim 15, wherein the patterned material removal process forms a widened section in the trenches where the insulator contacts the first and third gate stacks, and the widened section is wider than the second portion of the insulator.

17. The method of forming the integrated circuit structure according to claim 15, wherein the planarizing of the insulator down to the top of the fin forms a surface of the insulator contacting the first and third gate stacks to be coplanar with the top of the fin.

18. The method of forming the integrated circuit structure according to claim 15, wherein the planarizing of the insulator down to the top of the fin forms portions where the insulator contacts the first and third gate stacks, and where the second gate stack contacts the fin to be within a single plane.

19. The method of forming the integrated circuit structure according to claim 15, wherein the insulator comprises an oxide, and the protective liner comprises a nitride liner.

20. The method of forming the integrated circuit structure according to claim 15, wherein the second gate stack, the source and drain regions, and a portion of the fin that contacts the second gate stack form a functional transistor, and wherein the first and third gate stacks and the insulator connected to the first and third gate stacks form non-functional diffusion breaks on opposite sides of the functional transistor that insulate the functional transistor from other structures.

* * * * *